United States Patent
Su et al.

(10) Patent No.: US 6,802,250 B2
(45) Date of Patent: Oct. 12, 2004

(54) STENCIL DESIGN FOR SOLDER PASTE PRINTING

(75) Inventors: Chao-Yuan Su, Koahsiung (TW); Chia-Fu Lin, Hsin-Chu (TW); Hsin-Hui Lee, Kaohsiung (TW); Yen-Ming Chen, Hsin-Chu (TW); Kai-Ming Ching, Taiping (TW); Li-Chih Chen, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/151,377

(22) Filed: May 20, 2002

(65) Prior Publication Data

US 2003/0213384 A1 Nov. 20, 2003

(51) Int. Cl.⁷ .................................................. B41N 1/24
(52) U.S. Cl. ........................ 101/127; 101/114; 118/213
(58) Field of Search .................................. 101/114, 123, 101/127; 118/406, 213; 427/96, 282; 438/612, 613

(56) References Cited

U.S. PATENT DOCUMENTS

| | | | | |
|---|---|---|---|---|
| 5,460,316 A | * | 10/1995 | Hefele | 228/39 |
| 5,922,496 A | * | 7/1999 | Dalal et al. | 430/5 |
| 6,085,968 A | * | 7/2000 | Swindlehurst et al. | 228/254 |
| 6,631,675 B2 | * | 10/2003 | Brody et al. | 101/129 |

FOREIGN PATENT DOCUMENTS

| | | | |
|---|---|---|---|
| JP | 61-249790 | * | 11/1986 |
| JP | 62-052554 | * | 3/1987 |
| JP | 02-112993 | * | 4/1990 |
| JP | 03-075192 | * | 3/1991 |
| JP | 3-92390 | * | 4/1991 |
| JP | 07-276841 | * | 10/1995 |
| JP | 2001-130160 | * | 5/2001 |

* cited by examiner

Primary Examiner—Leslie J. Evanisko
(74) Attorney, Agent, or Firm—Tung & Associates

(57) ABSTRACT

A stencil design for solder paste printing, or other metal stencil printing, is disclosed. A stencil for stencil printing of solder onto a semiconductor wafer for semiconductor wafer bumping includes a substrate. The substrate has a hole defined therein substantially shaped to correspond to and receptive to the semiconductor wafer. An interior edge of the substrate surrounds the hole, and has an upper lip under which the semiconductor wafer is positioned. The upper lip of the interior edge of the substrate surrounding the hole substantially prevents the solder from flowing onto sides and a bottom of the semiconductor wafer during stencil printing of the solder. The cross-profile shape of the upper lip may in one embodiment be rectangular, whereas in another embodiment be triangular.

15 Claims, 4 Drawing Sheets

STENCIL DESIGN FOR SOLDER PASTE PRINTING

FIELD OF THE INVENTION

This invention relates generally to the solder paste stencil printing process used in semiconductor wafer bumping, and more particularly to the stencils that are used in this process.

BACKGROUND OF THE INVENTION

Historically, most semiconductor dies were packaged using wire bonding. Wire bonding involves the attachment of thin gold or aluminum wires between die bonding pads and lead connections in the package. The resulting packaged semiconductor dies are then attached to printed circuit boards (PCB's), or otherwise utilized. Wire bonding presents several problems, however. There are resistances associated with each bond. There are minimum height limits imposed by the required wire loops. There is the chance of electrical performance problems or shorting if the wires come too close to each other.

These problems are addressed by flip-chip technology, which more recently has been supplanting wire bonding. Flip-chip joining is a chip or package connection process where bumps of connecting metal are formed on the chip surface, and the chip is flipped over for soldering to the package, PCB, or otherwise. The wires in wire bonding are thus replaced with a deposited metal bump on each bonding pad. Connection to the package or PCB is made when the chip is flipped over and soldered. Packages are lower profile and the electrical connection is of lower resistance. The electrical path is also much shorter.

One important part of flip-chip joining is the wafer bumping process. Wafer bumping is the placement or fabrication of the metal bumps on each bonding pad of a die. Such metal bumps, or balls, can be solder or another metal. Wafer bumping is performed when the semiconductor dies are still connected to one another in semiconductor wafer form. Typically, solder is deposited via stencil printing, and then reflowing is performed so that the deposited solder forms spherical balls, or bumps.

FIGS. 1A–1F illustrate this solder-printing wafer-bumping process. In FIG. 1A, a semiconductor wafer 102 has a bonding pad 104 thereon, such as aluminum. A passivation layer 106 has been added on the wafer 102 such that only the bonding pad 104 is exposed. Because solder bumps do not adhere to aluminum pads, an under-bump metallization (UBM) layer 108 is sputtered. This is usually a trimetallic or bimetallic intermediary between the solder bumps and the aluminum pads. For instance, it may be a combination of aluminum, nickel vanadium, and copper.

In FIG. 1B, a photoresist mask 110 is added over the UBM layer 108 in the vicinity of the bonding pad 104. The photoresist mask 110 is added in the conventional manner of applying photoresist, patterning the photoresist, and developing the photoresist. In FIG. 1C, the UBM layer 108 is etched away except for under the photoresist mask 110. The photoresist mask 110 is then stripped or removed, as shown in FIG. 1D, leaving only the UBM layer 108 over the vicinity of the bonding pad 104. Next, in FIG. 1E, solder paste 112 or another metal used for wafer bumping is stencil printed thickly over the UBM layer 108. Finally, in FIG. 1F, the solder paste 112 is reflowed to form a solder bump.

The stencil printing process of FIG. 1E is more particularly shown in FIG. 2, which is a top view of a semiconductor wafer 204 within a stencil 202. The stencil 202 is aligned over the semiconductor wafer 204, where the stencil 202 has a pattern corresponding to the presence of aluminum pads and UBM layers thereover on the on the semiconductor wafer 204. Once the stencil is aligned over the semiconductor wafer 204, solder paste 208 is added to the top of the stencil 202. A squeegee 210 is then used to apply the solder paste 208 over the stencil 202, and onto the UBM layers and the aluminum pads of the wafer 204 as exposed through the stencil 202. Generally, a number of passes, such as six, are made with the squeegee 210 over the wafer 204.

FIG. 3 shows an enlarged side view of FIG. 2, where the edge of the semiconductor wafer 204 meets a typically designed stencil 202' according to the prior art. In particular, there is a gap 252 between the wafer 204 and the stencil 202', and the wafer 204 is substantially flush with the stencil 202' as to their top surfaces. Such an existing technology stencil for solder paste printing, however, can be problematic. As solder paste is squeegeed over the top surfaces of the stencil 202' and the wafer 204, some solder paste may get into the gap 252 between the two, and potentially flow underneath the wafer 204. This contamination is undesirable, and can increase the risk of the wafer 204 breaking, causing a decrease in yield.

Therefore, there is a need for preventing solder paste from flowing over the side of a semiconductor wafer and onto its backside during the solder paste stencil printing process. Such prevention should substantially eliminate solder paste contamination of the semiconductor wafer, and thus prevent yield reduction. For these and other reasons, therefore, there is a need for the present invention.

SUMMARY OF THE INVENTION

The invention relates to a stencil design for solder paste printing. A stencil for stencil printing of solder onto a semiconductor wafer for semiconductor wafer bumping includes a substrate. The substrate has a hole defined therein substantially shaped to correspond to and receptive to the semiconductor wafer. An interior edge of the substrate surrounds the hole, and has an upper lip under which the semiconductor wafer is positioned. The upper lip of the interior edge of the substrate surrounding the hole substantially prevents the solder from flowing onto sides and a bottom of the semiconductor wafer during stencil printing of the solder.

In one embodiment, the upper lip is rectangular in cross-profile shape. An outer interior edge of the substrate from the interior edge of the substrate having the upper lip is substantially adjacent to sides of the semiconductor wafer. The upper lip of the interior edge of the substrate surrounding the hole has an underside against which a top surface of the semiconductor wafer makes contact.

In another embodiment, the upper lip is triangular in cross-profile shape. An outer interior edge of the substrate from the interior edge of the substrate having the upper lip is such that a gap exists between the outer interior edge and sides of the semiconductor wafer. The upper lip of the interior edge of the substrate surrounding the hole has an angled-downward underside against which a top corner of the semiconductor wafer makes single-point contact.

Embodiments of the invention provide for advantages over the prior art. The top surface of the substrate is not flush with the top surface of the semiconductor wafer. During squeegeeing, the upper lip of the interior edge of the substrate prevents the solder from flowing onto the sides and the bottom of the semiconductor wafer. Where the upper lip has a rectangular cross-profile shape, this is because the adjacency of the underside of the upper lip to the top surface of the wafer prevents solder from flowing under underside of the upper lip, such that the solder does not reaches the sides or the bottom of the wafer. Where the upper lip has a triangular cross-profile shape, this is because the contact of a top corner of the semiconductor wafer with the angled underside of the upper lip prevents solder from flowing past this point of contact, such that solder does not reach the sides or the bottom of the wafer.

Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. For instance, whereas the invention is substantially described in relation to solder paste, other types of metal can be used as well. The following detailed description is, therefore, not to be taken in a limiting sense, and the scope of the present invention is defined only by the appended claims.

Figure 1A:
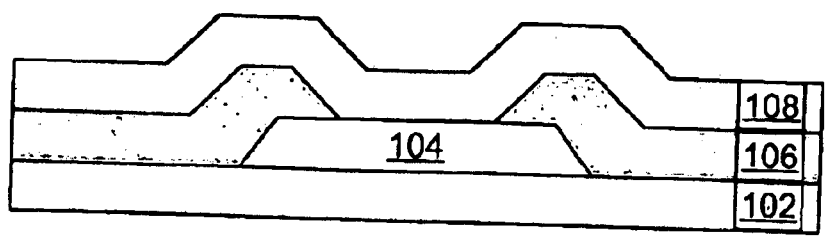
FIGS. 1A–1F are diagrams illustrating a typical solder paste stencil printing process and the subsequent wafer bumping process, to provide an under-bump metallization (UBM) layer over a metal pad of a wafer, and to provide a solder or other metal ball or bump on the UBM layer. Embodiments of the invention can be used in conjunction with the processes shown in FIGS. 1A–1F. In particular, stencil designs of the invention can be used in conjunction with the solder paste stencil printing shown specifically in FIG. 1E.
Figure 1B:
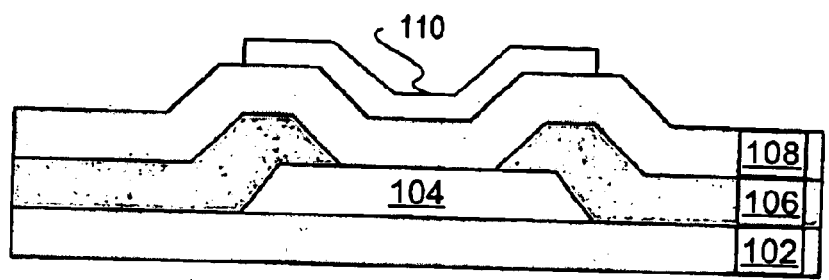
Figure 1C:
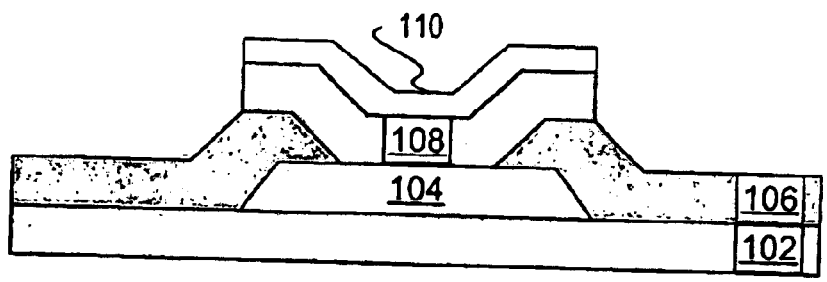
Figure 1D:
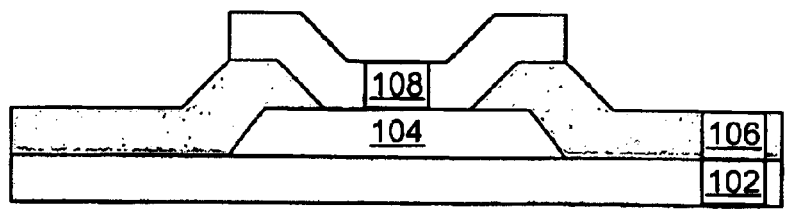
Figure 1E:
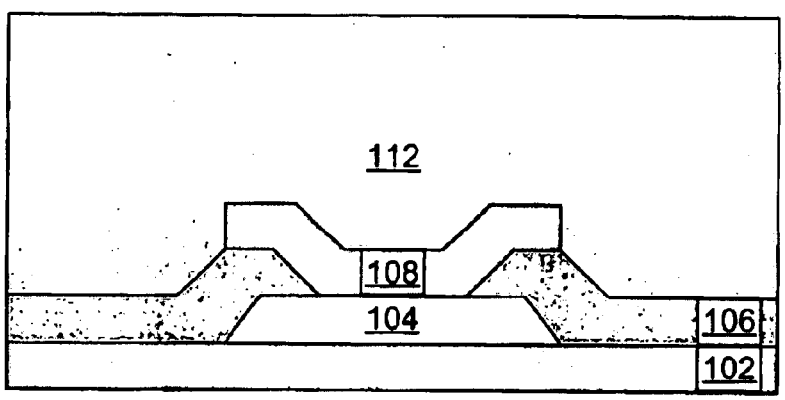
Figure 1F:
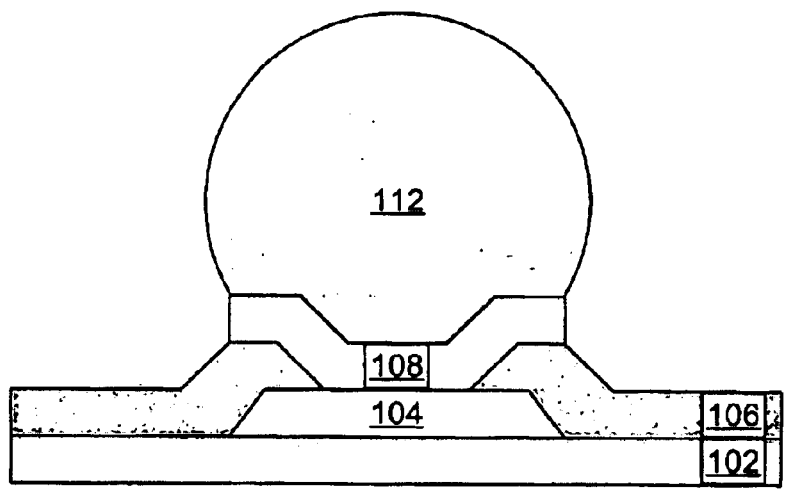
Figure 2:
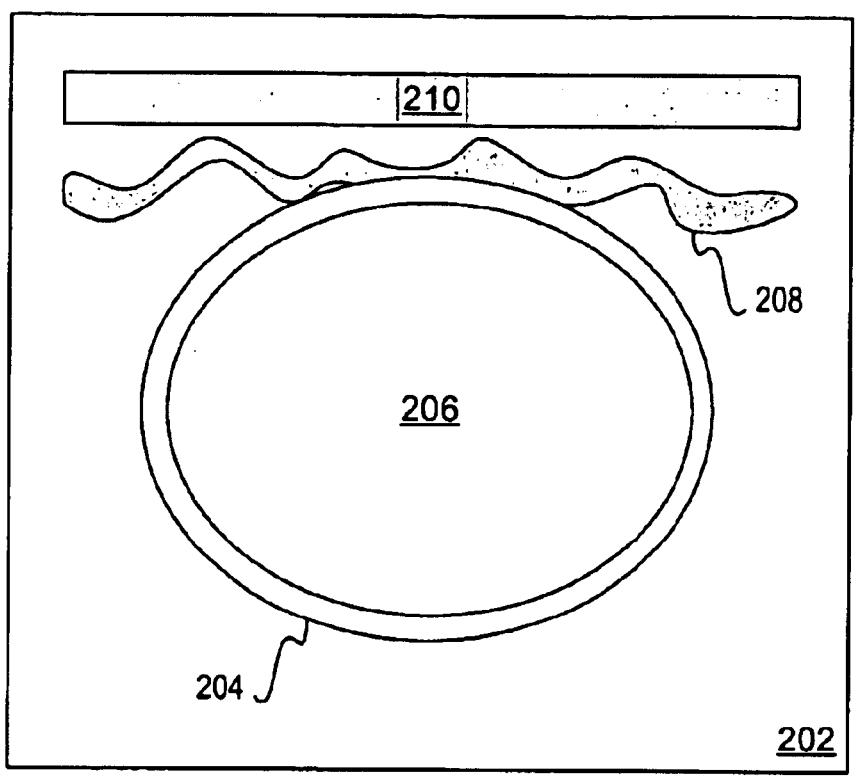
FIG. 2 is a diagram showing in detail a top view of a stencil and a semiconductor wafer performing the solder paste stencil printing process of FIG. 1E. A squeegee is used to apply solder over the semiconductor wafer situated within the stencil. Where the stencil in FIG. 2 is in accordance with one of the stencil designs of the invention, FIG. 2 can be said to depict the manner by which solder paste stencil printing is accomplished using a stencil according to an embodiment of the invention.
Figure 3:
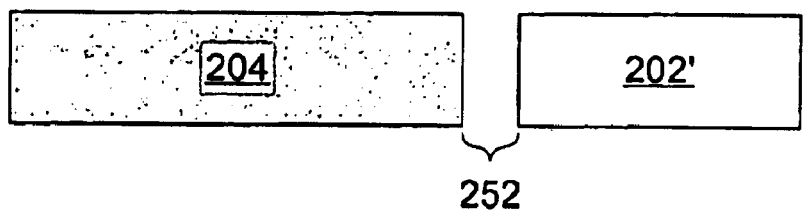
FIG. 3 is a diagram showing a side cross-sectional view of the process depicted in FIG. 2, where the stencil has a stencil design according to the prior art. The stencil design of the prior art permits the problematic flow of solder over the sides and onto the bottom surface of the semiconductor wafer.
Figure 4:
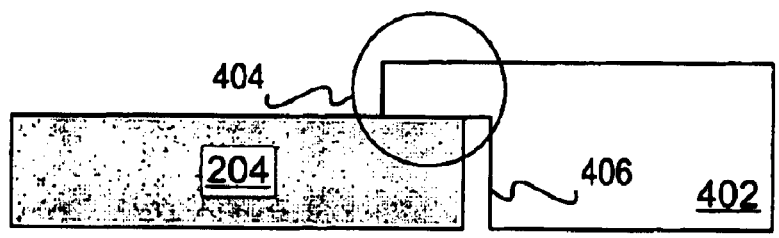
FIG. 4 is a diagram showing a side cross-sectional view of the process depicted in FIG. 2, where the stencil has a stencil design according to an embodiment of the invention. The stencil in particular has a rectangular in cross-sectional shape upper lip on an interior edge surrounding the hole in which the semiconductor wafer is placed. The stencil design of FIG. 4 prevents the problematic flow of solder over the sides and onto the bottom surface of the semiconductor wafer.

FIG. 4 shows one part of a stencil 402 and how it engages a semiconductor wafer 204, according to an embodiment of the invention. The diagram of FIG. 4 may be considered the side cross-sectional view of a solder paste stencil printing process, the top view of which is depicted in and has been described in conjunction with FIG. 2. In such instance, the stencil 402 acts as the stencil 202 of FIG. 2. The stencil 402 has a rectangular in cross-profile shape upper lip 404 as to its interior edge of the hole of the stencil 402 in which the semiconductor wafer 204 is positioned. The bottom surface of the upper lip 404 preferably makes contact with the upper surface of the semiconductor wafer 204, which prevents solder from flowing onto the sides and onto the bottom surface of the wafer 204. Furthermore, the stencil 402 has another interior edge 406 that is situated outward towards the end of the stencil 402 as compared to the upper lip 404. This interior edge 406 is preferably adjacent to the side of the semiconductor wafer 204. The upper lip can in one embodiment have a width of substantially one millimeter, and a height of between 0.05 and 0.15 millimeter.

Figure 5:
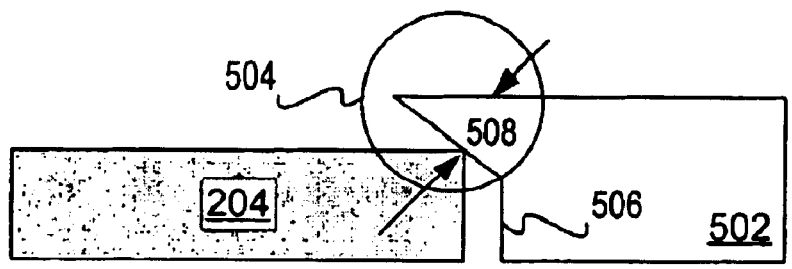
FIG. 5 is a diagram showing a side cross-sectional view of the process depicted in FIG. 2, where the stencil has a stencil design according to another embodiment of the invention. The stencil in particular has a triangular in cross-sectional shape upper lip on an interior edge surrounding the hole in which the semiconductor wafer is placed. The stencil design of FIG. 5 also prevents the problematic flow of solder over the sides and onto the bottom surface of the semiconductor wafer.

FIG. 5 shows one part of a stencil 502 and how it engages a semiconductor wafer 204, according to another embodiment of the invention. The diagram of FIG. 5 may also be considered the side cross-sectional view of a solder paste stencil printing process, the top view of which is depicted in and has been described in conjunction with FIG. 2. In such instance, the stencil 502 acts as the stencil 202 of FIG. 2. The stencil 502 has a triangular in cross-profile shape upper lip 504 as to its interior edge of the hole of the stencil 502 in which the semiconductor wafer 204 is positioned. The downward-angled bottom surface of the upper lip 504 preferably makes single-point contact with a top corner of the semiconductor wafer 204, which prevents solder from flowing onto the sides and onto the bottom surface of the wafer 204. Furthermore, the stencil 502 has another interior edge 506 that is situated outward towards the end of the stencil 502 as compared to the upper lip 504. There is preferably a gap between the interior edge 506 and the side of the semiconductor wafer 204. The upper lip may have an angle 508 of between thirty and forty-five degrees.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A stencil for stencil printing of solder onto a semiconductor wafer for semiconductor wafer bumping comprising:

a substrate having a hole defined therein substantially shaped to correspond to and receptive to the semiconductor wafer as a whole; and, an interior edge of the substrate surrounding the hole and having an upper lip under and directly against which outer-most edges of the semiconductor wafer are adapted to be positioned without a gap therebetween, wherein the upper lip of the interior edge of the substrate surrounding the hole substantially prevents the solder from flowing onto the outer-most edges and a bottom of the semiconductor wafer during stencil printing of the solder.

2. The stencil of claim 1, wherein the upper lip of the interior edge of the substrate surrounding the hole is rectangular in cross-profile shape.

3. The stencil of claim 1, further comprising an outer interior edge of the substrate from the interior edge of the substrate having the upper lip, the outer interior edge substantially adjacent to outer-most sides of the semiconductor wafer.

4. The stencil of claim 1, wherein the upper lip of the interior edge of the substrate surrounding the hole is rectangular in cross-profile shape, such that an outer interior edge of the substrate from the interior edge of the substrate having the upper lip is substantially adjacent to outer-most sides of the semiconductor wafer.

5. The stencil of claim 1, wherein the upper lip of the interior edge of the substrate surrounding the hole has an underside against which an exterior upper corner edge of the semiconductor wafer is adapted to makes contact.

6. The stencil of claim 1, wherein the upper lip of the interior edge of the substrate surrounding the hole is triangular in cross-profile shape, such that an exterior upper corner edge of the semiconductor wafer is adapted to make contact.

7. The stencil of claim 1, further comprising an outer interior edge of the substrate from the interior edge of the substrate having the upper lip, a gap existing between the outer interior edge and outer-most sides of the semiconductor wafer.

8. The stencil of claim 1, wherein the upper lip of the interior edge of the substrate surrounding the hole is triangular in cross-profile shape, such that a gap exists between sides of the semiconductor wafer and an outer interior edge of the substrate from the interior edge of the substrate having the upper lip.

9. The stencil of claim 1, wherein the upper lip of the interior edge of the substrate surrounding the hole is such that a top corner of the semiconductor wafer is adapted to makes single-point contact thereagainst.

10. A stencil for stencil printing of metal onto a semiconductor wafer for semiconductor wafer bumping comprising:

a substrate having a hole defined therein substantially shaped to correspond to and receptive to the semiconductor wafer as a whole; and, an interior edge of the substrate surrounding the hole and having a rectangular in cross-profile shape upper lip under and directly against which outer-most edges of the semiconductor wafer are adapted to be positioned without a gap therebetween, wherein the upper lip of the interior edge of the substrate surrounding the hole substantially prevents the solder from flowing onto the outer-most edges and a bottom of the semiconductor wafer during stencil printing of the solder.

11. The stencil of claim 10, further comprising an outer interior edge of the substrate from the interior edge of the substrate having the upper lip, the outer interior edge substantially adjacent to outer-most sides of the semiconductor wafer.

12. The stencil of claim 10, wherein the upper lip of the interior edge of the substrate surrounding the hole has an underside against which a top surface of the semiconductor wafer is adapted to makes contact.

13. A stencil for stencil printing of metal onto a semiconductor wafer for semiconductor wafer bumping comprising:

a substrate having a hole defined therein substantially shaped to correspond to and receptive to the semiconductor wafer as a whole; and, an interior edge of the substrate surrounding the hole and having a triangular in cross-profile shape upper lip under and directly against which outer-most edges of the semiconductor wafer is are adapted to be positioned without a gap therebetween, wherein the upper lip of the interior edge of the substrate surrounding the hole substantially prevents the solder from flowing onto the outer-most edges and a bottom of the semiconductor wafer during stencil printing of the solder.

14. The stencil of claim 13, further comprising an outer interior edge of the substrate from the interior edge of the substrate having the upper lip, a gap existing between the outer interior edge and outer-most sides of the semiconductor wafer.

15. The stencil of claim 13, wherein the upper lip of the interior edge of the substrate surrounding the hole has an angled-downward underside against which an exterior upper corner edge of the semiconductor wafer is adapted to makes single-point contact.

* * * * *